(12) United States Patent
Hallett et al.

(10) Patent No.: US 9,965,198 B2
(45) Date of Patent: May 8, 2018

(54) INTERNALLY PRECONDITIONING SOLID STATE DRIVES FOR VARIOUS WORKLOADS

(71) Applicant: HGST Netherlands B.V., Amsterdam (NL)

(72) Inventors: Timothy Glen Hallett, Oronoco, MN (US); Anton John Neu, Oronoco, MN (US); Phillip Peterson, Rochester, MN (US)

(73) Assignee: Western Digital Technologies, Inc., Irvine, CA (US)

( * ) Notice: Subject to any disclaimer, the term of this patent is extended or adjusted under 35 U.S.C. 154(b) by 73 days.

(21) Appl. No.: 15/216,541

(22) Filed: Jul. 21, 2016

(65) Prior Publication Data

US 2018/0024753 A1 Jan. 25, 2018

(51) Int. Cl.
| | |
|---|---|
| G06F 12/00 | (2006.01) |
| G06F 3/06 | (2006.01) |
| G06F 12/06 | (2006.01) |
| G06F 12/02 | (2006.01) |

(52) U.S. Cl.
CPC .......... *G06F 3/0613* (2013.01); *G06F 3/0632* (2013.01); *G06F 3/0679* (2013.01);
(Continued)

(58) Field of Classification Search
CPC .... G06F 3/0613; G06F 3/0632; G06F 3/0679; G06F 3/0685; G06F 12/06;
(Continued)

(56) References Cited

U.S. PATENT DOCUMENTS

| | | |
|---|---|---|
| 5,347,489 A | 9/1994 | Merchant et al. |
| 5,537,357 A | 7/1996 | Merchant et al. |

(Continued)

OTHER PUBLICATIONS

"SMART Storage Systems is now SanDisk Enterprise Storage Solutions", http://www.storagesearch.com/smartmodstor.html; accessed Aug. 28, 2015; 6 pgs.
(Continued)

*Primary Examiner* — Reba I Elmore
(74) *Attorney, Agent, or Firm* — Loza & Loza, LLP; Gabriel Fitch

(57) ABSTRACT

Systems and methods for internally preconditioning SSDs for various workloads are disclosed. One such method involves (1) receiving preconditioning parameters including an invalidity distribution across ribbons, a transfer size of workloads, and a randomness of workloads, (2) generating workload data including a percentage of random data and a percentage of non-random data, where the percentages are based on the randomness of workloads parameter, (3) determining preselected physical block addresses (PBAs) of a ribbon using the invalidity distribution parameter, (4) writing a portion of the workload data to each of the preselected PBAs of the ribbon using a preselected transfer size until the ribbon is full, where the transfer size is based on the transfer size of workloads parameter, (5) marking all PBAs of the ribbon that were not preselected using the invalidity distribution parameter as being invalid, and (6) repeating (2) to (5) until a preselected end condition is met.

18 Claims, 5 Drawing Sheets

(52) U.S. Cl.
CPC ............ *G06F 12/06* (2013.01); *G06F 3/0685* (2013.01); *G06F 12/0223* (2013.01); *G06F 12/0623* (2013.01); *G06F 12/0692* (2013.01); *G06F 2212/1016* (2013.01); *G06F 2212/2022* (2013.01); *G06F 2212/7206* (2013.01)

(58) Field of Classification Search
CPC ............ G06F 12/0223; G06F 12/0623; G06F 12/0692; G06F 2212/1016; G06F 2212/2022; G06F 2212/7206
USPC ........ 711/103, 166, 170; 365/174, 202, 212, 365/230.99
See application file for complete search history.

(56) References Cited

U.S. PATENT DOCUMENTS

| | | | |
|---|---|---|---|
| 6,233,178 | B1 | 5/2001 | Krishnamurthy et al. |
| 6,262,916 | B1 | 7/2001 | Kuriyama et al. |
| 7,433,228 | B2 | 10/2008 | Kuo et al. |
| 8,239,618 | B2 | 8/2012 | Kotzur et al. |
| 2005/0132371 | A1* | 6/2005 | Lopez-Estrada .... G06F 9/44505 718/100 |
| 2014/0088920 | A1 | 3/2014 | Griffin et al. |

OTHER PUBLICATIONS

STB Suite, "SSD and SSS Preconditioning Test in DMM", http://www.stbsuite.com/support/virtual-training-center/ssd-and-sss-hdd-preconditioning-test-in-dmm; accessed Aug. 28, 2015; 6 pgs.

Kudryavtsev, Andrey "How to benchmark SSDs with FIO Visualizer" IT Peer Network, Mar. 27, 2015; https://communities.intel.com/community/itpeernetwork/blog/2015/03/27/how-to-benchmark-ssds-with-fio-visualizer; accessed Aug. 28, 2015; 3 pgs.

Smith, Kent "Benchmarking SSDs: The Devil is in the Preconditioning Details", Aug. 17, 2009; http://www.flashmemorysummit.com/English/Collaterals/Proceedings/2009/20090811_F2A_Smith.pdf; 12 pgs.

* cited by examiner

| Parameters : | Invalidity Across Ribbons = | [ 50%, 50%, 10%, 90% ] | | |
|---|---|---|---|---|
| | Age of Ribbons = | [ 14, 15, 16, 17 ] | | |
| | Erase Count = | [ 20, 22, 24, 26 ] | | |
| | Xfer Size of Workload = | 8kb (2 LBNs @ 1 LBN=4k) | | |
| | Randomness of Workload = | 90% (10% xfers will be sequential with last LBN) | | |
| | | | | |
| Ribbon Number | | 0 | 1 | 2 | 3 |
| Ribbon MetaData | Seq / Age | 14 | 15 | 16 | 17 |
| Ribbon MetaData | Erase Count | 20 | 22 | 24 | 26 |
| Ribbon PBA Slot Offset | 0 | RandLBN [ 0 ] | RandLBN [ 5 ] | RandLBN [ 9 ] | invalid |
| Ribbon PBA Slot Offset | 1 | RandLBN [ 0 ] + 1 | RandLBN [ 5 ] + 1 | RandLBN [ 9 ] + 1 | invalid |
| Ribbon PBA Slot Offset | 2 | invalid | invalid | RandLBN [ 10 ] | invalid |
| Ribbon PBA Slot Offset | 3 | invalid | invalid | RandLBN [ 10 ] + 1 | invalid |
| Ribbon PBA Slot Offset | 4 | RandLBN [ 1 ] | RandLBN [ 6 ] | RandLBN [ 11 ] | invalid |
| Ribbon PBA Slot Offset | 5 | RandLBN [ 1 ] + 1 | RandLBN [ 6 ] + 1 | RandLBN [ 11 ] + 1 | invalid |
| Ribbon PBA Slot Offset | 6 | invalid | invalid | RandLBN [ 12 ] | RandLBN [ 17 ] + 2 |
| Ribbon PBA Slot Offset | 7 | invalid | invalid | RandLBN [ 12 ] + 1 | RandLBN [ 17 ] + 3 |
| Ribbon PBA Slot Offset | 8 | RandLBN [ 2 ] | RandLBN [ 7 ] | RandLBN [ 13 ] | invalid |
| Ribbon PBA Slot Offset | 9 | RandLBN [ 2 ] + 1 | RandLBN [ 7 ] + 1 | RandLBN [ 13 ] + 1 | invalid |
| Ribbon PBA Slot Offset | 10 | invalid | invalid | RandLBN [ 14 ] | invalid |
| Ribbon PBA Slot Offset | 11 | invalid | invalid | RandLBN [ 14 ] + 1 | invalid |
| Ribbon PBA Slot Offset | 12 | RandLBN [ 3 ] | RandLBN [ 8 ] | invalid | invalid |
| Ribbon PBA Slot Offset | 13 | RandLBN [ 3 ] + 1 | RandLBN [ 8 ] + 1 | invalid | invalid |
| Ribbon PBA Slot Offset | 14 | invalid | invalid | RandLBN [ 15 ] | invalid |
| Ribbon PBA Slot Offset | 15 | invalid | invalid | RandLBN [ 15 ] + 1 | invalid |
| Ribbon PBA Slot Offset | 16 | RandLBN [ 4 ] | RandLBN [ 8 ] + 2 | RandLBN [ 16 ] | invalid |
| Ribbon PBA Slot Offset | 17 | RandLBN [ 4 ] + 1 | RandLBN [ 8 ] + 3 | RandLBN [ 16 ] + 1 | invalid |
| Ribbon PBA Slot Offset | 18 | invalid | invalid | RandLBN [ 17 ] | invalid |
| Ribbon PBA Slot Offset | 19 | invalid | invalid | RandLBN [ 17 ] + 1 | invalid |
| | | | | | |
| Calculated Invalidity % | | 10/20 = 50% | 10/20 = 50% | 2/20 = 10% | 18/20 = 90% |
| (Slots Invalid/Total Slots) | | | | | |

Invalidity Across Ribbons Ribbon[0] = 50%

Either valid random LBN addresses & data are dropped to band, or invalid (can be garbage collected) depending on % invalidity.

Randomness of Workload = 90%

Approx every 10 Xfers, one will be sequential with previous randomly generated Logical Block Address

Xfer Size of Workload Parameter = 2 LBNs

2LBNs will be dropped consecutively on a ribbon, with the first LBN being randomly generated, and the second being consecutive with the final Logical Block Address on the first LBN.

*FIG. 3*

INTERNALLY PRECONDITIONING SOLID STATE DRIVES FOR VARIOUS WORKLOADS

FIELD

Aspects of the disclosure relate generally to solid state drives (SSDs), and more specifically, to internally preconditioning SSDs for various workloads.

BACKGROUND

In a variety of consumer electronics, solid state drives (SSDs) incorporating non-volatile memories (NVMs) are frequently replacing or supplementing conventional rotating hard disk drives for mass storage. These non-volatile memories may include one or more flash memory devices, the flash memory devices may be logically divided into blocks, and each of the blocks may be further logically divided into addressable pages. These addressable pages may be any of a variety of sizes (e.g., 512 Bytes, 1 Kilobytes, 2 Kilobytes, 4 Kilobytes), which may or may not match the logical block address sizes used by a host computing device.

When testing the performance of SSDs, it is often desirable to compare SSDs under the same or similar operating conditions. Because a new SSD with no blocks containing invalid data, as often occurs with any SSD operating at steady state, will perform faster than a heavily used one, testers often bring an SSD to a state similar to steady state conditions under actual use. Thus, before performance testing an SSD, a tester will often precondition the SSD to a steady state condition by writing the SSD one or multiple times.

However, the preconditioning of a large capacity SSDs can be a time consuming process, requiring multiple full drive writes, sequential then random, ensuring all logical block addresses (LBAs) are valid, mapped in an indirection table, and other such tasks. As drives get larger and larger, this process time increases dramatically, rendering it incredibly time consuming to measure and characterize steady state performance. For example, a 3.84 terabyte (TB) drive might take 28 or more hours for one state of preconditioning, and 4 or more days for another state of preconditioning. Accordingly, an improved method for preconditioning SSDs is needed.

SUMMARY

In one aspect, this disclosure relates to a method for internally preconditioning a solid state drive (SSD) including a non-volatile memory (NVM), the method including (1) receiving a plurality of preselected preconditioning parameters including an invalidity distribution across ribbons, a transfer size of workloads, and a randomness of workloads, (2) generating workload data including a preselected percentage of random data and a preselected percentage of non-random data, wherein the preselected percentage of random data and the preselected percentage of non-random data are based on the randomness of workloads parameter, (3) determining a plurality of preselected physical block addresses (PBAs) of a ribbon of the NVM using the invalidity distribution across ribbons parameter, (4) writing a portion of the workload data to each of the preselected PBAs of the ribbon using a preselected transfer size until the ribbon is full, wherein the preselected transfer size is based on the transfer size of workloads parameter, (5) marking all PBAs of the ribbon that were not preselected using the invalidity distribution across ribbons parameter as being invalid, and (6) repeating (2) to (5) until a preselected end condition is met.

In another aspect, this disclosure relates to a system for internally preconditioning a solid state drive (SSD), the system including a memory, a non-volatile memory (NVM), a processor coupled to the memory and the NVM and configured to (1) receive a plurality of preselected preconditioning parameters including an invalidity distribution across ribbons, a transfer size of workloads, and a randomness of workloads, (2) generate workload data including a preselected percentage of random data and a preselected percentage of non-random data, wherein the preselected percentage of random data and the preselected percentage of non-random data are based on the randomness of workloads parameter, (3) determine a plurality of preselected physical block addresses (PBAs) of a ribbon of the NVM using the invalidity distribution across ribbons parameter, (4) write a portion of the workload data to each of the preselected PBAs of the ribbon using a preselected transfer size until the ribbon is full, wherein the preselected transfer size is based on the transfer size of workloads parameter, (5) mark all PBAs of the ribbon that were not preselected using the invalidity distribution across ribbons parameter as being invalid, and (6) repeat (2) to (5) until a preselected end condition is met.

BRIEF DESCRIPTION OF THE DRAWINGS

FIG. 3 is an example invalidity layout for a 4 ribbon SSD based on preselected parameters in accordance with one embodiment of the disclosure.

DETAILED DESCRIPTION

Figure 1:
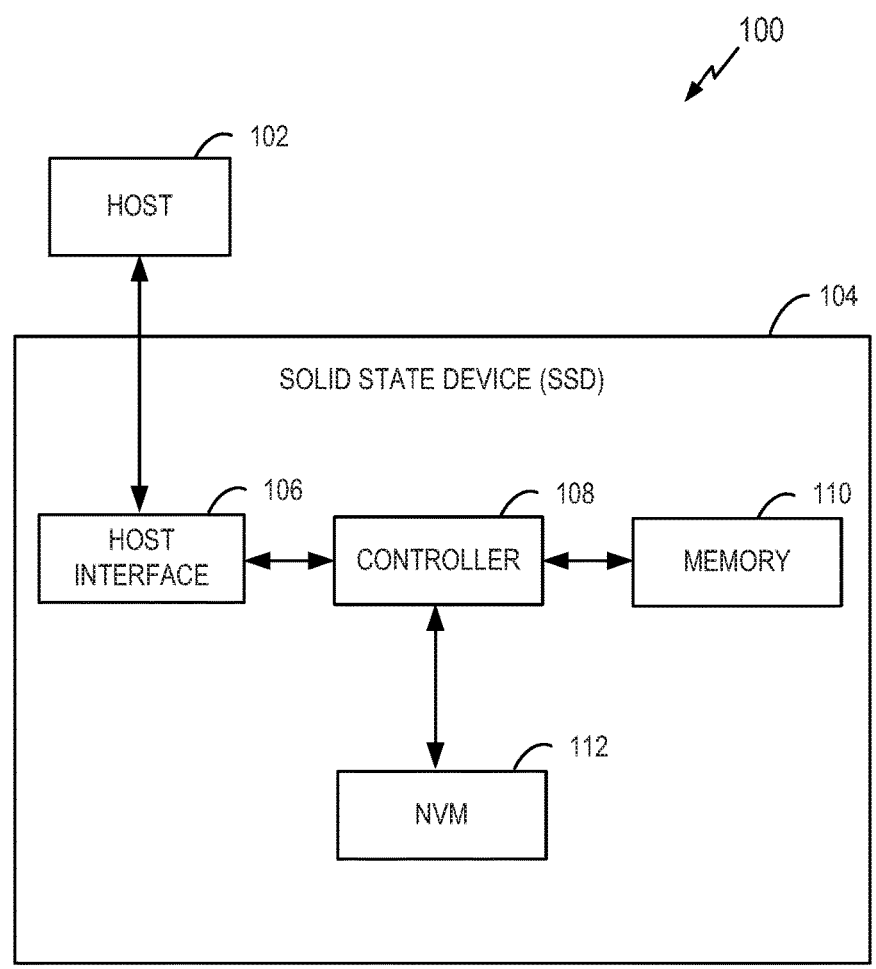
FIG. 1 is a block diagram of a solid state device (SSD) that can perform internal preconditioning of the SSD with a preselected workload in accordance with one embodiment of the disclosure.

Referring now to the drawings, systems and methods for internally preconditioning SSDs for various workloads based on a preselected set of parameters are illustrated. One such method involves internally preconditioning an SSD including a non-volatile memory (NVM) by (1) receiving a plurality of preselected preconditioning parameters including an invalidity distribution across ribbons, a transfer size of workloads, and a randomness of workloads, (2) generating workload data including a preselected percentage of random data and a preselected percentage of non-random data, where the preselected percentage of random data and the preselected percentage of non-random data are based on the randomness of workloads parameter, (3) determining a plurality of preselected physical block addresses (PBAs) of a ribbon of the NVM using the invalidity distribution across ribbons parameter, (4) writing a portion of the workload data to each of the preselected PBAs of the ribbon using a preselected transfer size until the ribbon is full, where the preselected transfer size is based on the transfer size of workloads parameter, (5) marking all PBAs of the ribbon that were not preselected using the invalidity distribution across ribbons parameter as being invalid, and (6) repeating (2) to (5) until a preselected end condition is met. In one aspect, the preselected end condition is met when each ribbon in the NVM is full. One such system for internally preconditioning a SSD includes a memory, a non-volatile memory (NVM), and a processor coupled to the memory and the NVM and configured to perform the method described above.

In contrast to related art preconditioning techniques that externally condition SSDs (e.g., using a host), aspects of the systems and methods described herein can involve internally preconditioning an SSD. As a result, the systems and methods of internal preconditioning described herein allow much more rapid characterization of SSD performance, particularly as changes are being made to the design of the drive (e.g., in the firmware or elsewhere). In addition, these systems and methods of internal preconditioning may dramatically shrink the code-test cycle, and/or allow a firmware developer many more opportunities to make and fine-tune performance tweaks.

FIG. 1 is a block diagram of a solid state device (SSD) that can perform internal preconditioning of the SSD with a preselected workload in accordance with one embodiment of the disclosure. The system 100 includes a host 102 and a SSD storage device 104 coupled to the host 102. The host 102 provides commands to the SSD storage device 104 for transferring data between the host 102 and the SSD storage device 104. For example, the host 102 may provide a write command to the SSD storage device 104 for writing data to the SSD storage device 104 or read command to the SSD storage device 104 for reading data from the SSD storage device 104. The host 102 may be any system or device having a need for data storage or retrieval and a compatible interface for communicating with the SSD storage device 104. For example, the host 102 may a computing device, a personal computer, a portable computer, or workstation, a server, a personal digital assistant, a digital camera, a digital phone, or the like.

The SSD storage device 104 includes a host interface 106, a controller 108, a memory 110, and a non-volatile memory 112. The host interface 106 is coupled to the controller 108 and facilitates communication between the host 102 and the controller 108. Additionally, the controller 108 is coupled to the memory 110 and the non-volatile memory 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 102 includes the SSD storage device 104. In other embodiments, the SSD storage device 104 is remote with respect to the host 102 or is contained in a remote computing system coupled in communication with the host 102. For example, the host 102 may communicate with the SSD storage device 104 through a wireless communication link.

The controller 108 controls operation of the SSD storage device 104. In various embodiments, the controller 108 receives commands from the host 102 through the host interface 106 and performs the commands to transfer data between the host 102 and the non-volatile memory 112. The controller 108 may include any type of processing device, such as a microprocessor, a microcontroller, an embedded controller, a logic circuit, software, firmware, or the like, for controlling operation of the SSD storage device 104.

In some embodiments, some or all of the functions described herein as being performed by the controller 108 may instead be performed by another element of the SSD storage device 104. For example, the SSD storage device 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host 102 and the non-volatile memory 112. For example, the memory 110 or a portion of the memory 110 may be a cache memory.

The non-volatile memory (NVM) 112 receives data from the controller 108 and stores the data. The non-volatile memory 112 may be any type of non-volatile memory, such as a flash storage system, a solid state drive, a flash memory card, a secure digital (SD) card, a universal serial bus (USB) memory device, a CompactFlash card, a SmartMedia device, a flash storage array, or the like.

The controller 108 or NVM 112 can be configured to perform any of the processes for internally preconditioning a SSD with a preselected workload described herein.

Figure 2:
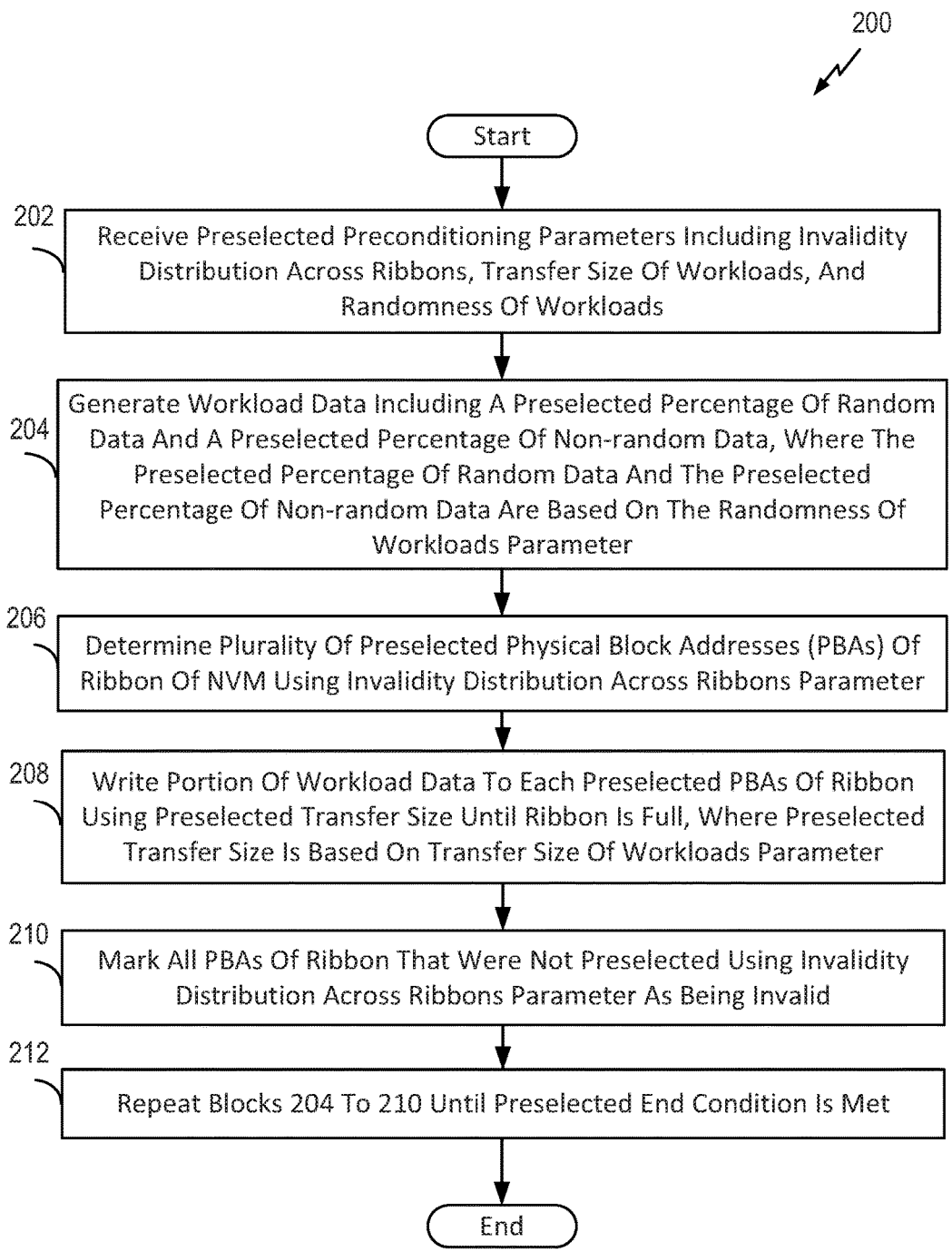
FIG. 2 is a flow chart of a process for internally preconditioning a SSD with a preselected workload in accordance with one embodiment of the disclosure.

FIG. 2 is a flow chart of a process 200 for internally preconditioning a SSD with a preselected workload in accordance with one embodiment of the disclosure. In particular embodiments, process 200 can be performed by the controller 108 of FIG. 1 (e.g., at the SSD).

In block 202, the process receives a plurality of preselected preconditioning parameters including an invalidity distribution across ribbons, a transfer size of workloads, and a randomness of workloads. In one aspect, the process receives the preselected preconditioning parameters from a host, such as the host 102 of FIG. 1. In one aspect the preselected preconditioning parameters can also include an age of ribbons parameter.

In one aspect, the invalidity distribution across ribbons parameter can specify a number of the physical block addresses (PBAs) that are invalid in a particular ribbon. In another aspect, the invalidity distribution across ribbons parameter can specify a percentage indicative of the number of the physical block addresses (PBAs) that are invalid in a particular ribbon. In several embodiments, the invalidity distribution across ribbons parameter may specify the invalidity information for a particular ribbon or a number of ribbons (e.g., an array of ribbons).

In one aspect, the age of ribbons parameter can specify the number of times any particular ribbon in the SSD has been erased (e.g., number of erase cycles).

In one aspect, the transfer size of workloads can specify a preselected transfer size of data to be written to a particular ribbon or to all ribbons in the SSD. In one aspect, the transfer size of workloads can be 4 kilobytes (Kb) or up to 64 Kb. This parameter often has a notable effect on internal algorithms such as this process, and other algorithms such as garbage collection and the like.

In one aspect, the randomness of workloads parameter specifies a value between 0 and 1 (e.g., a percentage) where 0 corresponds to being fully sequential (e.g., no randomness) and 1 corresponds to being fully random. In one aspect, the randomness of workloads parameter has a notable effect on algorithms such as garbage collections and defragmentation. In one aspect, the randomness of workloads parameter applies to all ribbons in the SSD. In another aspect, the randomness of workloads parameters can include a separate parameter for each ribbon in the SSD.

In block 204, the process generates workload data including a preselected percentage of random data and a preselected percentage of non-random data, where the preselected percentage of random data and the preselected percentage of non-random data are based on the randomness of workloads parameter. In one aspect the process may use a random number generator to generate the random data. In one such aspect, the process may use a pseudo random number generator (PRNG), possibly with a long period length and even uniformity. In one aspect, the randomness of workloads parameter can be 100 percent. In such case, the preselected percentage of random data would be 100 percent and the workload data would only include random data. In another aspect, the randomness of workloads parameter can be 0 percent. In such case, the preselected percentage of non-random data would be 100 percent and the workload data would only include non-random (e.g., sequential) data.

In one aspect, the random data and non-random data can be logical block addresses, which may often be stored at memory addresses in SSDs. In some aspects, the workload data can also include additional data such as arbitrary host data. In one such case, the arbitrary data may be generated using a random number seed (e.g., such as any or all of the preconditioning parameters). In one aspect, the additional data of the workload data can include any or all of the preconditioning parameters. In one aspect, the workload data can be viewed as including one portion that is metadata and another portion that is arbitrary host data. The metadata can include the random data and the non-random data, where such data can be logical block addresses. The metadata can further include a cyclic redundancy check (CRC), where the CRC may be generated using the corresponding logical block address as a seed.

In block 206, the process determines a plurality of preselected physical block addresses (PBAs) of a ribbon of the NVM using the invalidity distribution across ribbons parameter. In one aspect, the process determines the number of PBAs in the ribbon to be written and the suitable slots. For example, if the invalidity distribution across ribbons parameter is 50 percent, then the process can select half of the PBAs for writing data. The suitable slots may be determined using both the invalidity distribution across ribbons parameter and the transfer size of workloads parameter.

In block 208, the process then writes a portion of the workload data to each of the preselected PBAs of the ribbon (e.g., determined in block 206) using a preselected transfer size until the ribbon is full, where the preselected transfer size is based on the transfer size of workloads parameter.

In block 210, the process marks all PBAs of the ribbon that were not preselected using the invalidity distribution across ribbons parameter as being invalid.

In block 212, the process repeats blocks 204 to 210 until a preselected end condition is met. In one aspect, the preselected end condition is met when each ribbon in the NVM is full. In other aspects, the preselected end condition could be met when some ribbons are full and others are fully erased.

In one aspect, the process also searches an indirection table of the SSD for holes (e.g., zeros). The process can then write random data from the workload data, or other random data, to each of the holes. In effect, the process can thereby assign random mapping to holes in the indirection table. The indirection table is a large table used to map logical block addresses (LBAs) to physical block addresses. In one aspect, the indirection table may be implemented as a flat array, a tree, or another suitable data structure.

In one aspect, the process updates a ribbon erase count table of the SSD based on the age of ribbons parameter. In one aspect, the preselected preconditioning parameters can also include an erase count for each ribbon.

In one aspect, the process can perform the sequence of actions in a different order. In another aspect, the process can skip one or more of the actions. In other aspects, one or more of the actions are performed simultaneously. In some aspects, additional actions can be performed.

Other variations of the process could include passing other types of parameters down to the drive. These new parameters could include, but are not limited to, NAND voltage thresholds, NAND defect mappings and other specific implementation parameters, where NAND relates to NAND flash memories as are commonly used in NVMs.

FIG. 3 is an example invalidity layout 300 for a 4 ribbon SSD based on preselected parameters in accordance with one embodiment of the disclosure. In one aspect, the example layout 300, representing a possible SSD layout, can be generated by the preconditioning method/process of FIG. 2 using the noted parameters (e.g., preselected parameters). As can be seen at the top of FIG. 3, the preselected parameters include an invalidity across ribbons set of parameters of [50%, 50%, 10%, 90%], an age of ribbons set of parameters of [14, 15, 16, 17], an erase count set of parameters of [20, 22, 24, 26], a transfer ("Xfer") size of workload(s) parameter of 8 kilobytes or kB (e.g., 2 LBNs where 1 LBN has a size of 4 kB), and a randomness of workload(s) of 90% (e.g., where 10% of transfers will be sequential with the last LBN, effectively non-random). In other embodiments, a subset of these parameters may be used.

As can be seen below the parameter list in FIG. 3, there are 4 ribbons numbered 0 to 3 and 20 physical block addresses (PBAs/slots) per ribbon. The layout 300 has a table like format with columns for the "Ribbon PBA Slot Offset" number and ribbon number. At the top of the table, ribbon metadata such as the age (which can also be referred to as sequence or "seq") and erase count are listed for each ribbon number. In the lower section of the table, the table illustrates the content of each address/slot of the ribbon and whether random data (e.g., see ribbon 0 at slot offsets 0 and 1), non-random data (e.g., see ribbon 1 at slot offsets 16 and 17), or invalid data is stored in the respective slot (e.g., memory location). In one aspect, while the data illustrated at ribbon 0 and slot offsets 0 and 1 might seem at least partly sequential since it lists "RandLBN[0]" and "RandLBN[0]+ 1", the two slot block is being written as a unit and is collectively random.

As can be seen just below the table, the calculated invalidity (slots invalid/total slots) corresponds exactly to the invalidity across ribbons parameter for each ribbon. As can be seen throughout the table, the preconditioning process writes 2 PBAs at a time with random or non-random data (e.g., ribbon 0 at slots 0 and 1) where the number of PBAs written to corresponds to the transfer size of workloads. As can be seen in the table, the preconditioning process intersperses non-random data (e.g., non-random LBAs) with random data (e.g., random LBAs) at a rate corresponding the randomness of workloads parameter, 90% in this case. As such, approximately every 10 transfers, the data written to the designated slot can be non-random or sequential. In other embodiments, the process may operate in different ways depending on the parameters. While not shown in FIG. 3, each slot written to may include additional data such as metadata and arbitrary host data. The metadata can include the random LBAs and the non-random LBAs. The metadata can further include a cyclic redundancy check (CRC), where the CRC may be generated using the corresponding logical block address as a seed. In one aspect, the logical block address (LBA) is stored at each slot (e.g., PBA) in the ribbon (e.g., SSD) as a data integrity check such that the stored LBA can match the corresponding LBA stored in the indirection table.

Figure 4:
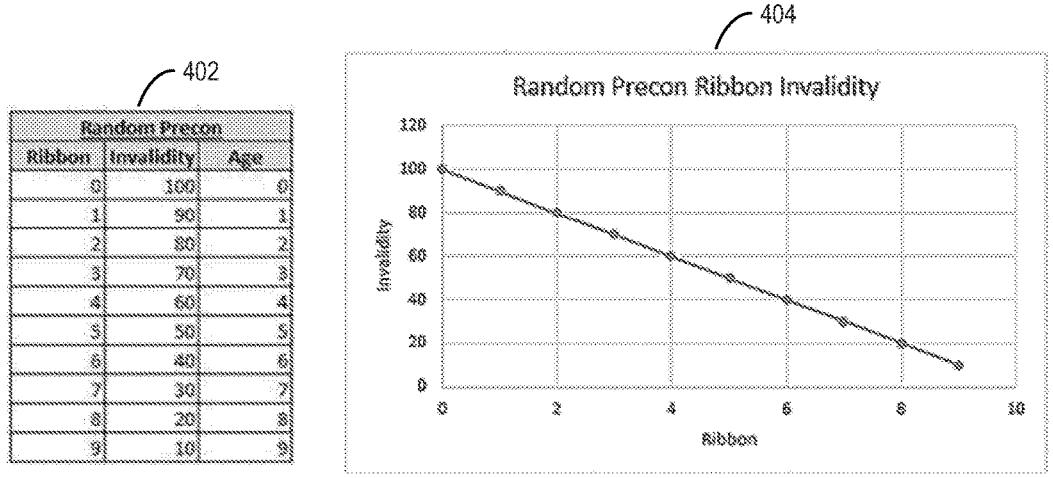
FIG. 4 is a table and corresponding graph of random sample data for an invalidity distribution across ribbons parameter that can be used to internally precondition an SSD in accordance with one embodiment of the disclosure.

FIG. 4 is a table 402 and corresponding graph 404 of random sample data for an invalidity distribution across ribbons parameter that can be used to internally precondition an SSD in accordance with one embodiment of the disclosure. In the example of FIG. 4, it is assumed that there are 10 ribbons. The table 402 shows the ribbon number and the corresponding invalidity distribution and age. For example, ribbon 0 has an invalidity of 100 and an age of 0. The graph 404 shows the invalidity versus the ribbon number and the resulting curve is fairly linear given the randomly assigned sample data.

Figure 5:
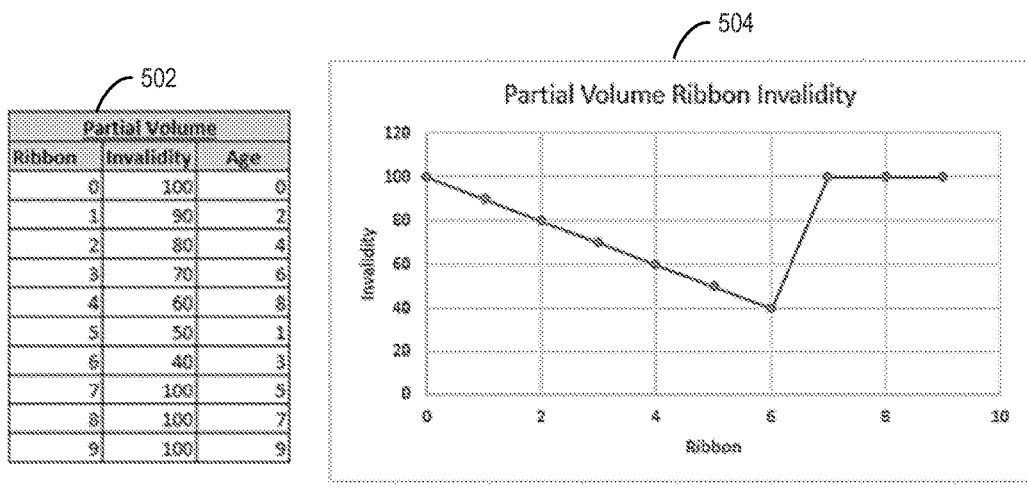
FIG. 5 is a table and corresponding graph of partial volume sample data for an invalidity distribution across ribbons parameter that can be used to internally precondition an SSD in accordance with one embodiment of the disclosure.

FIG. 5 is a table 502 and corresponding graph 504 of partial volume sample data for an invalidity distribution across ribbons parameter that can be used to internally precondition an SSD in accordance with one embodiment of the disclosure. In the example of FIG. 5, it is again assumed that there are 10 ribbons. The table 502 shows the ribbon number and the corresponding invalidity distribution and age. For example, ribbon 0 has an invalidity of 100 and an age of 0. The graph 504 shows the invalidity versus the ribbon number and the resulting curve given the partial volume assigned sample data. In one aspect, partial volume can be defined as a workload where only a subset of the LBAs of the drive are used. This results in the characteristics displayed in FIG. 5, where more ribbons have high invalidity since the logical block addresses repeat and invalidate their previous ribbon locations at a higher frequency.

Figure 6:
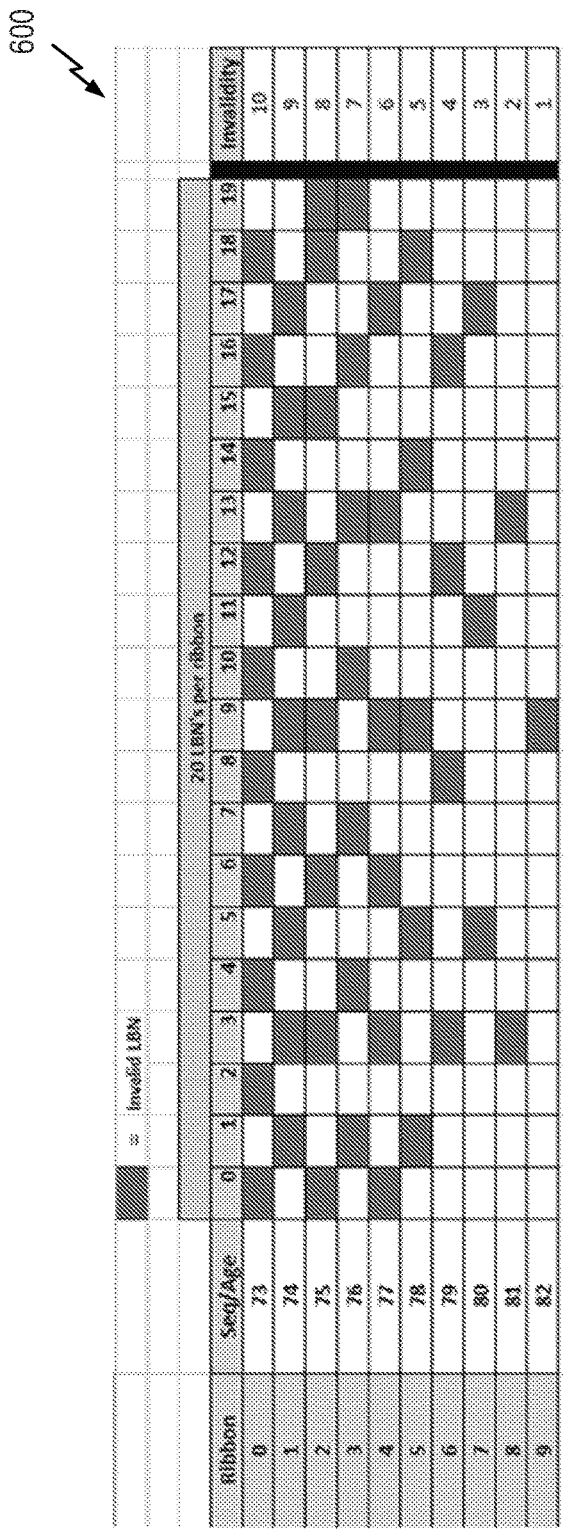
FIG. 6 is an example invalidity layout for a 10 ribbon SSD based on preselected parameters in accordance with one embodiment of the disclosure.

FIG. 6 is an example invalidity layout 600 for a 10 ribbon SSD based on preselected parameters in accordance with one embodiment of the disclosure. As can be seen from FIG. 6, there are 20 logical block numbers (LBNs) per ribbon, where each LBN is composed of multiple LBAs. The layout 600 has a table like format with columns for the ribbon number, the age (which can also be referred to as sequence or "seq"), the ribbon layout, and the invalidity (e.g., invalidity distribution across ribbons). For example, ribbon 0 has an age of 73, an invalidity of 10, and a corresponding layout illustrating that 10 of the LBNs have been made to be invalid. A list of the parameters 602 is illustrated below the layout 600.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A method for internally preconditioning a solid state drive (SSD) comprising a non-volatile memory (NVM), the method comprising:
   (1) receiving a plurality of preselected preconditioning parameters comprising an invalidity distribution across ribbons, a transfer size of workloads, and a randomness of workloads;
   (2) generating workload data comprising a preselected percentage of random data and a preselected percentage of non-random data, wherein the preselected percentage of random data and the preselected percentage of non-random data are based on the randomness of workloads parameter;
   (3) determining a plurality of preselected physical block addresses (PBAs) of a ribbon of the NVM using the invalidity distribution across ribbons parameter;
   (4) writing a portion of the workload data to each of the preselected PBAs of the ribbon using a preselected transfer size until the ribbon is full, wherein the preselected transfer size is based on the transfer size of workloads parameter;
   (5) marking all PBAs of the ribbon that were not preselected using the invalidity distribution across ribbons parameter as being invalid; and
   (6) repeating (2) to (5) until a preselected end condition is met.

2. The method of claim 1, wherein the repeating (2) to (5) until the preselected end condition is met comprises repeating (2) to (5) until each ribbon in the NVM is full.

3. The method of claim 1:
   wherein the receiving the plurality of preselected preconditioning parameters comprises receiving, from a host at the SSD, the plurality of preselected precondition parameters;
   wherein the generating the workload data comprises generating, at the SSD, the workload data;

wherein the determining the plurality of preselected PBAs comprises determining, at the SSD, the plurality of preselected PBAs; and wherein the writing a portion of the workload data to each of the preselected PBAs of the ribbon comprises writing, at the SSD, a portion of the workload data to each of the preselected PBAs of the ribbon.

4. The method of claim 1, further comprising:
searching an indirection table of the SSD for holes; and
writing random data from the workload data to each of the holes.

5. The method of claim 1, wherein the plurality of preselected preconditioning parameters further comprises an age of ribbons;
the method further comprising:
updating a ribbon erase count table of the SSD based on the age of ribbons parameter.

6. The method of claim 1, wherein the generating the workload data comprises generating the workload data using a pseudo random number generator.

7. The method of claim 1, wherein the transfer size of workloads parameter comprises at least one of 4 k blocks or 64 k blocks.

8. The method of claim 1, wherein the randomness of workloads parameter is a value between zero and one, inclusive.

9. The method of claim 1, further comprising:
determining logical block addresses for each of the plurality of PBAs using either the random data of the workload data or the non-random data of the workload data; and
wherein the writing the portion of the workload data to each of the preselected PBAs of the ribbon comprises writing one of the logical block addresses to each of the preselected PBAs of the ribbon.

10. A system for internally preconditioning a solid state drive (SSD), the system comprising:
a memory;
a non-volatile memory (NVM);
a processor coupled to the memory and the NVM and configured to:
(1) receive a plurality of preselected precondition parameters comprising an invalidity distribution across ribbons, a transfer size of workloads, and a randomness of workloads;
(2) generate workload data comprising a preselected percentage of random data and a preselected percentage of non-random data, wherein the preselected percentage of random data and the preselected percentage of non-random data are based on the randomness of workloads parameter;
(3) determine a plurality of preselected physical block addresses (PBAs) of a ribbon of the NVM using the invalidity distribution across ribbons parameter;
(4) write a portion of the workload data to each of the preselected PBAs of the ribbon using a preselected transfer size until the ribbon is full, wherein the preselected transfer size is based on the transfer size of workloads parameter;
(5) mark all PBAs of the ribbon that were not preselected using the invalidity distribution across ribbons parameter as being invalid; and
(6) repeat (2) to (5) until a preselected end condition is met.

11. The system of claim 10, wherein the processor is further configured to repeat (2) to (5) until each ribbon in the NVM is full.

12. The system of claim 10, wherein the processor is further configured to receive, from a host, the plurality of preselected precondition parameters.

13. The system of claim 10, wherein the processor is further configured to:
search an indirection table of the SSD for holes; and
write random data from the workload data to each of the holes.

14. The system of claim 10:
wherein the plurality of preselected preconditioning parameters further comprises an age of ribbons; and
wherein the processor is further configured to update a ribbon erase count table of the SSD based on the age of ribbons parameter.

15. The system of claim 10, wherein the processor is further configured to generate the workload data using a pseudo random number generator.

16. The system of claim 10, wherein the transfer size of workloads parameter comprises at least one of 4 k blocks or 64 k blocks.

17. The system of claim 10, wherein the randomness of workloads parameter is a value between zero and one, inclusive.

18. The system of claim 10, wherein the processor is further configured to:
determine logical block addresses for each of the plurality of PBAs using either the random data of the workload data or the non-random data of the workload data; and
write one of the logical block addresses to each of the preselected PBAs of the ribbon.

* * * * *